US005528464A

United States Patent [19]

Hamaguchi et al.

[11] Patent Number: 5,528,464
[45] Date of Patent: Jun. 18, 1996

[54] SHELF ASSEMBLY OF ELECTRONIC APPARATUS

[75] Inventors: Akihiro Hamaguchi; Hiroshi Uchiumi; Masakazu Ikegawa; Hisao Ohsone, all of Kawasaki, Japan

[73] Assignee: Fujitsu Limited, Kawasaki, Japan

[21] Appl. No.: 279,898

[22] Filed: Jul. 26, 1994

[30] Foreign Application Priority Data

Feb. 9, 1994 [JP] Japan ................................. 6-015499

[51] Int. Cl.⁶ ..................................................... H05K 7/14
[52] U.S. Cl. ........................... 361/796; 361/799; 361/802; 361/752; 439/61
[58] Field of Search ..................................... 361/796–799, 361/801, 802, 752, 754, 756, 759; 174/17 R; 439/327, 328, 345, 325, 61; 220/315; 206/334

[56] References Cited

U.S. PATENT DOCUMENTS 5,140,501  8/1992  Takahashi et al. ........................ 361/415
5,175,536  8/1990  Aschliman et al. ................. 340/825.04

*Primary Examiner*—Leo P. Picard
*Assistant Examiner*—Y. Whang
*Attorney, Agent, or Firm*—Staas & Halsey

[57] ABSTRACT

A shelf assembly which has realized an easy mounting of a back wiring board to a shelf. The shelf assembly comprises a shelf including a cross beam connecting a pair of side walls on a rear side thereof; and a back-board mounting frame including a pair of side plates each having a vertical guide groove, a first upper connection member and a second upper connection member for connecting the side plates, a first intermediate connection member and a second intermediate connection member for connecting the side plates, and a lower connection member for connecting the side plates. The shelf assembly further comprises a back wiring board inserted into the back-board mounting frame from above along the guide grooves formed in the side plates; and fixing means for fixing the back-board mounting frame to the shelf.

7 Claims, 10 Drawing Sheets

SHELF ASSEMBLY OF ELECTRONIC APPARATUS

BACKGROUND OF THE INVENTION

1. Field of the Invention

This invention relates generally to a shelf assembly of an electronic apparatus such as a communication apparatus, and more particularly to a mounting structure of a back wiring board to a shelf.

2. Description of the Related Art

There is a tendency that a demand for mounting electronic devices and equipment, such as communication devices, in high density. Usually, a vertical mounting of a printed wiring board is employed. In a vertical mounting of a printed wiring board of a communication device, electronic circuit packages each including a printed wiring board, on which a plurality of electronic parts such as LSI having an electronic circuit formed thereon are mounted as one group, are received in a shelf with their vertical postures, each electronic circuit package is connected to a back wiring board provided on a rear side of the shelf, with the use of a connector, thereby constituting a shelf unit. A loading of a plurality of such shelf units onto a rack completes a constitution of a communication device.

A conventional method for mounting a back wiring board to a shelf generally employs a way for mounting a back wiring board to a shelf from a rear side of the shelf and securing the back wiring board to the shelf by screws which are screwed into a rear surface of the back wiring board. However, this mounting method is practically impossible to apply to a local station electronic switch board which employs a rear surface mating structure of a rack, because only a front surface maintenance can be made. In order to make it possible to perform a variety of maintenance works of a back wiring board from the front side, there is known another mounting method in which a back wiring board is screwed tight to a back-board mounting frame and the back-board mounting frame is screwed tight to a shelf from a front side of the shelf.

According to the second-mentioned mounting method, it is sure that the front surface maintenance of the back wiring board is improved. However, since the back wiring board is screwed tight to the back-board mounting frame, many working processes are required. Moreover, the back-board mounting frame, which is employed in this mounting method, has the shortcomings in that a structure thereof is complicated and a weight thereof is heavy.

A press hit pin, which is inserted in the back wiring board, is allowed to project from the rear surface side in order to facilitate a jumper connection to be made on the rear surface side of the back wiring board. Therefore, when the back wiring board is placed directly on the floor, there is a fear that the pin is bent to form a short circuit with its adjacent pin. In order to prevent this, it is desirable from a view point of reliability to employ a back-board mounting frame. The conventional back-board mounting frame structure is complicated because it employs a mounting method in which the back wiring board is laid over the back-board mounting frame.

SUMMARY OF THE INVENTION

It is therefore an object of the present invention to provide a shelf assembly which is capable of realizing an easy mounting of a back wiring board to a shelf.

Another object of the present invention is to provide a shelf assembly in which a structure of a back-board mounting frame is simplified and which is reduced in total weight.

In accordance with an aspect of the present invention, there is provided a shelf assembly comprising a shelf including a pair of side walls, an upper member and a bottom member, and a cross beam for connecting the side walls on rear side thereof; a back-board mounting frame having pair of side plates each having a vertical guide groove, a first upper connection member and a second upper connection member for connecting the side plates, a first intermediate connection member and a second intermediate connection member for connecting the side plates, and a lower connection member for connecting the side plates; a back wiring board inserted into the back-board mounting frame from above along the guide grooves formed in the side plates; and fixing means for fixing the back-board mounting frame to the shelf.

Since the side plates of the back-board mounting frame include vertical guide grooves, the back wiring board can be inserted into the back-board mounting frame from above along the guide grooves and therefore, the number of the steps for assembling the self assembly can be reduced.

In accordance with another aspect of the present invention, there is provided a shelf assembly comprising a first shelf including a pair of side walls, an upper member and a bottom member for connecting the side walls, and a shelf guide rail formed on the bottom member; a second shelf including a pair of side plates, an upper member and a bottom member each having a plurality of guide grooves and adapted to connect the side plates, and a back plate for connecting the side plates, each of said side plates having a vertical guide groove formed therein adjacent to the back plate, the second shelf being inserted in the first shelf along the shelf guide rail; a back wiring board inserted into the second shelf from above along the guide grooves formed in the side plates of the second shelf; and fixing means for fixing the second shelf to the first shelf.

Since the vertical guide grooves are formed in the side plates of the second shelf, the back wiring board can be inserted into the second shelf from above along the guide grooves. The second shelf is inserted into the first shelf along the shelf guide rail formed on the first shelf and fixed to the first shelf by the fixing means such as screws.

The above and other objects, features and advantages of the present invention and the manner of realizing them will become more apparent, and the invention itself will best be understood from a study of the following description and appended claims with reference to the attached drawings showing some preferred embodiments of the invention.

DESCRIPTION OF THE PREFERRED EMBODIMENTS

Figure 1:
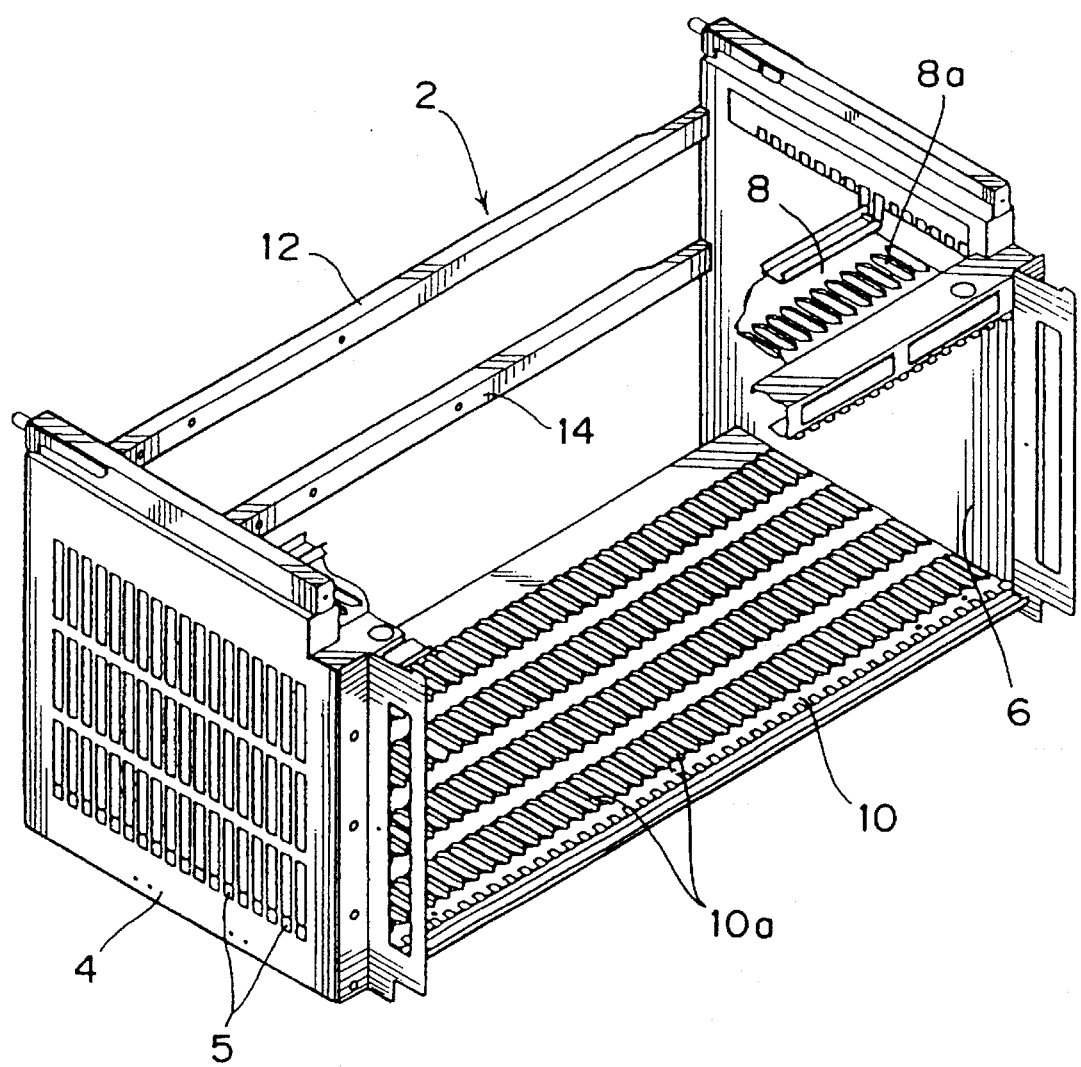
FIG. 1 is a partly cut away perspective view of a shelf.

Referring to FIG. 1, there is shown a partly cut away perspective view of a shelf according to a first embodiment of the present invention. The shelf 2 comprises a pair of side walls 4 and 6; an upper member 8 and a bottom member 10; and an upper cross beam 12, an intermediate cross beam 14 and a lower cross beam, not shown, all beams for connecting the side walls 4 and 6 on rear side thereof.

A plurality of vent holes 5 are formed in the side walls 4 and 6. The upper member 8 has a plurality of guide grooves 8a formed by upwardly press-punching the upper member 8, and the bottom member 10 has a plurality of guide grooves 10a formed by upwardly press-punching the bottom member 10. Electronic circuit packages, not shown, are inserted into the shelf 2 along the guide grooves 8a and 10a.

Figure 2:
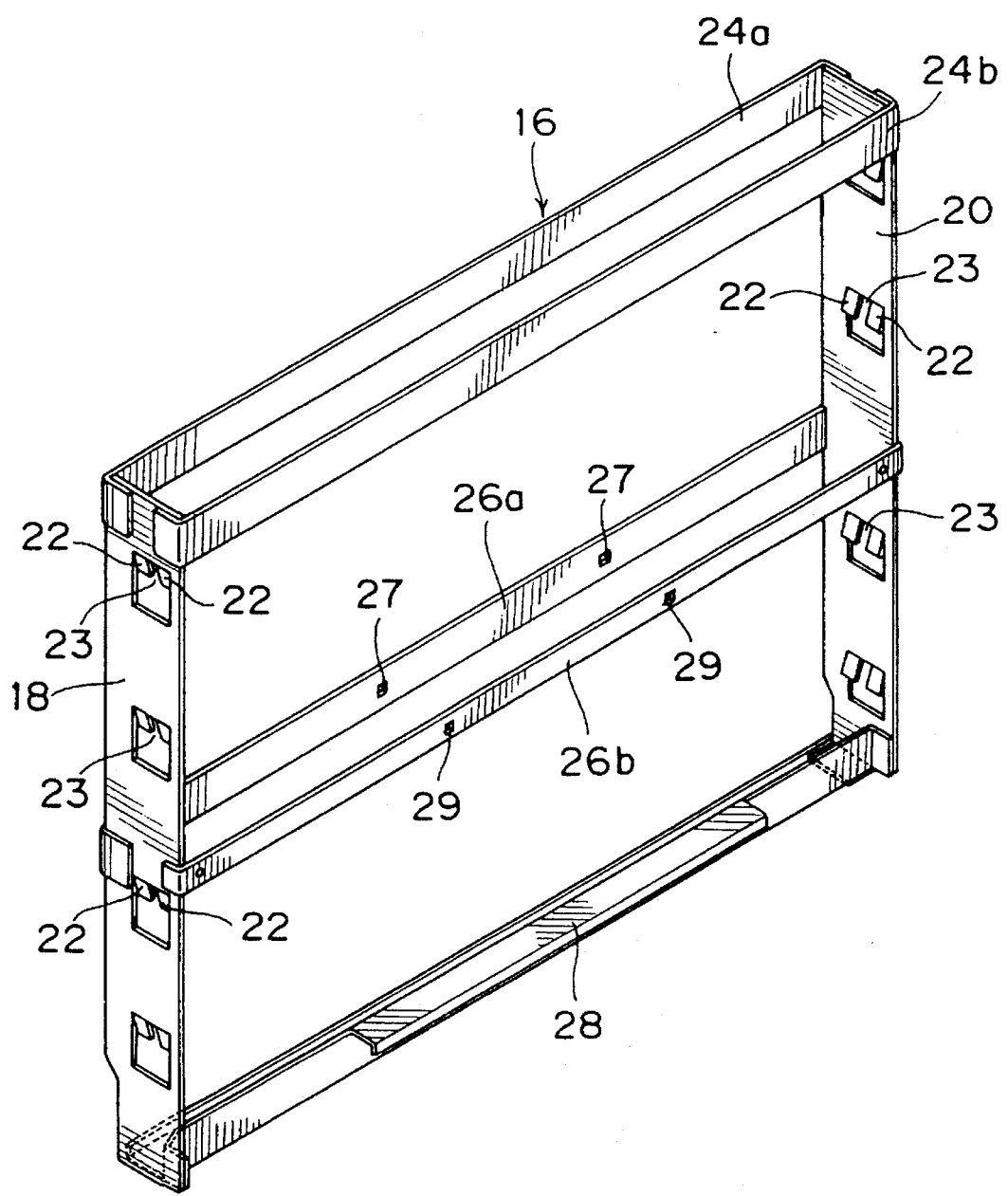
FIG. 2 is a perspective view of a back-board mounting frame.

FIG. 2 shows a perspective view of a back-board mounting frame. The back-board mounting frame 16 includes a pair of side plates 18 and 20. Each of the side plates 18 and 20 includes vertical guide grooves 23 each of which is formed between each pair of upwardly press-punched portions 22 and 22. The side plates 18 and 20 are connected at upper end portions thereof by first and second upper connection members 24a and 24b, at intermediate portions thereof by first and second intermediate connection members 26a and 26b, and at lower end portions thereof by a lower connection member 28. Two square holes 27 for allowing mold members to be inserted as later described are formed in the first intermediate connection member 26a, and two square holes 29 for allowing mold members to be inserted are also formed in the second intermediate connection member 26b.

Figure 3:
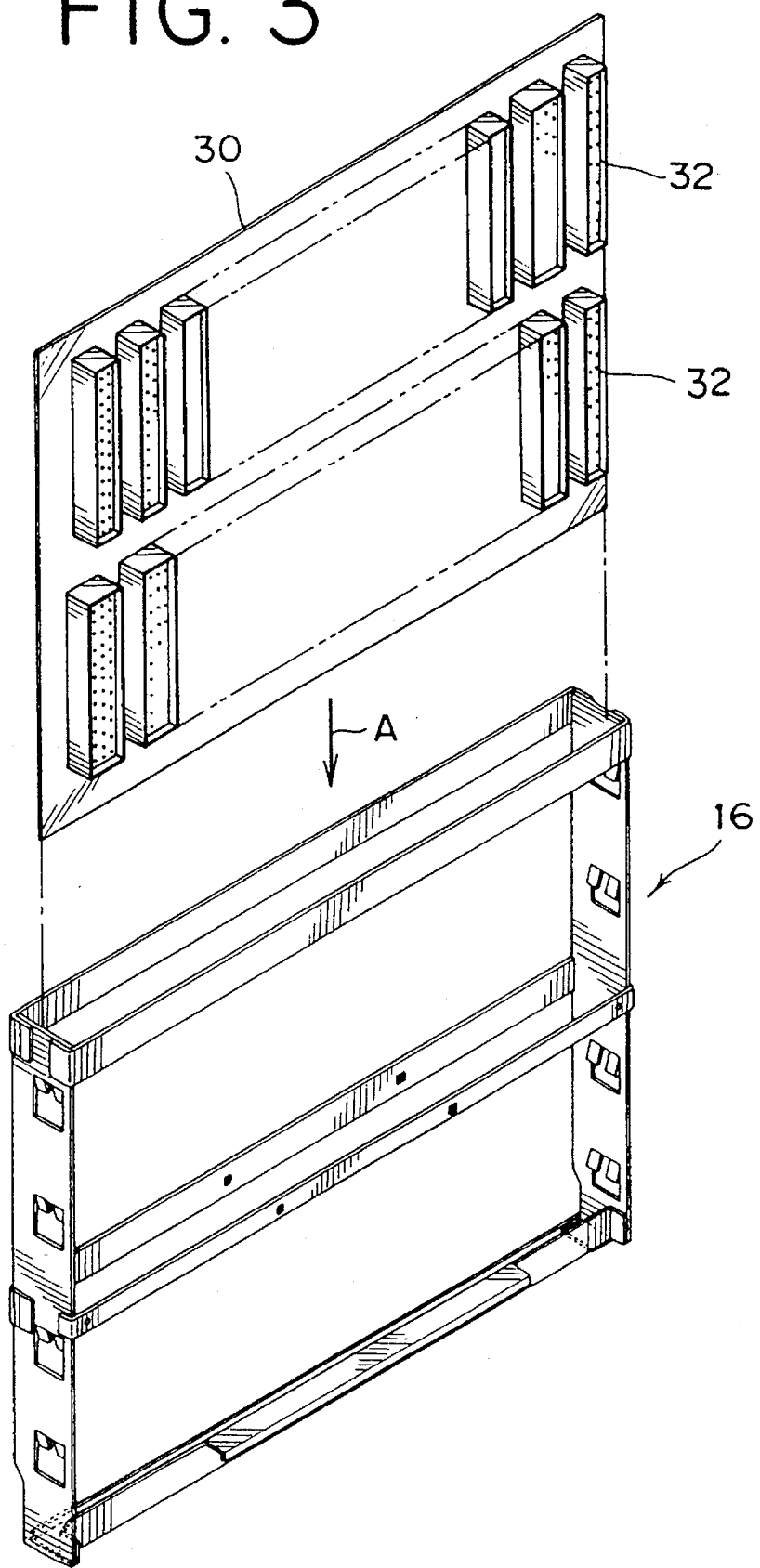
FIG. 3 is a view explanatory of a method of mounting a back wiring board.

Referring to FIG. 3, a plurality of connectors 32 are mounted on a back wiring board 30. Press hit pins of each connector 32 are allowed to project from a rear surface of the back wiring board 30. The back wiring board 30 is inserted into the back-board mounting frame 16 from above as indicated by an arrow A, guided by the vertical guide grooves 23 formed in the side plates 18 and 20 of the back-board mounting frame 16, and fully received in the back-board mounting frame 16. The back-board mounting frame 16 with the back wiring board 30 thus received therein is inserted into the shelf 2 of FIG. 1 from a front side thereof and fixed to the intermediate cross beam 14 of the shelf 2.

Figure 4:
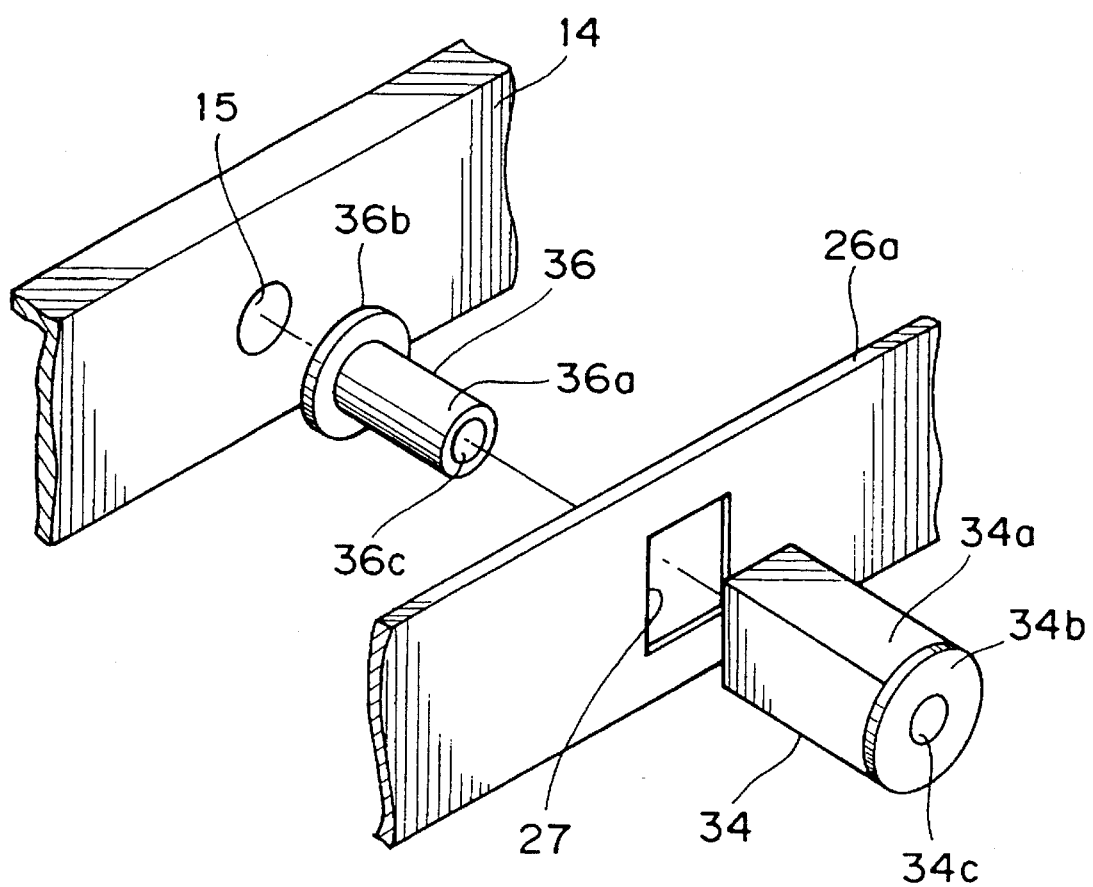
FIG. 4 is an exploded perspective view showing a part of means for fixing a back-board mounting frame.

This fixing method will now be described with reference to FIGS. 4, 5A and 5B. FIG. 4 is an exploded perspective view showing a part of a means for fixing the back-board mounting frame 16. A quadrangular column-shaped insert portion 34a of each mold member 34 is dinserted into each square hole 27 of the first intermediate connection member 26a. The size of a head 34b of the mold member 34 is larger than that of the square hole 27. The mold member 34 has a stepped axial through-hole 34c as shown in sectional views of FIGS. 5A and 5B.

An insert nut 36 is inserted in the through-hole 34c of the mold member 34. The insert nut 36 includes a cylindrical insert portion 36a to be inserted into the through-hole 34c of the mold member 34, and a head 36b. An axial threaded hole 36c is formed in the insert nut 36. A threaded hole 15 is formed in the intermediate cross beam 14 of the shelf 2.

Firstly, after the mold member 34 is inserted into the square hole 27 of the first intermediate connection member 26a, the insert nut 36 is inserted into the stepped through-hole 34c of the mold member 34. Likewise, after the mold member 34 is inserted into the square hole 29 of the second intermediate connection member 26b, the insert nut 36 is inserted into the mold member 34. Then, as shown in FIG. 3, the back wiring board 30 is inserted into the back-board mounting frame 16 from above. The back wiring board 30 has holes at corresponding locations to the square holes 27 and 29 of the first and second intermediate connection members 26a and 26b.

Figure 5A:
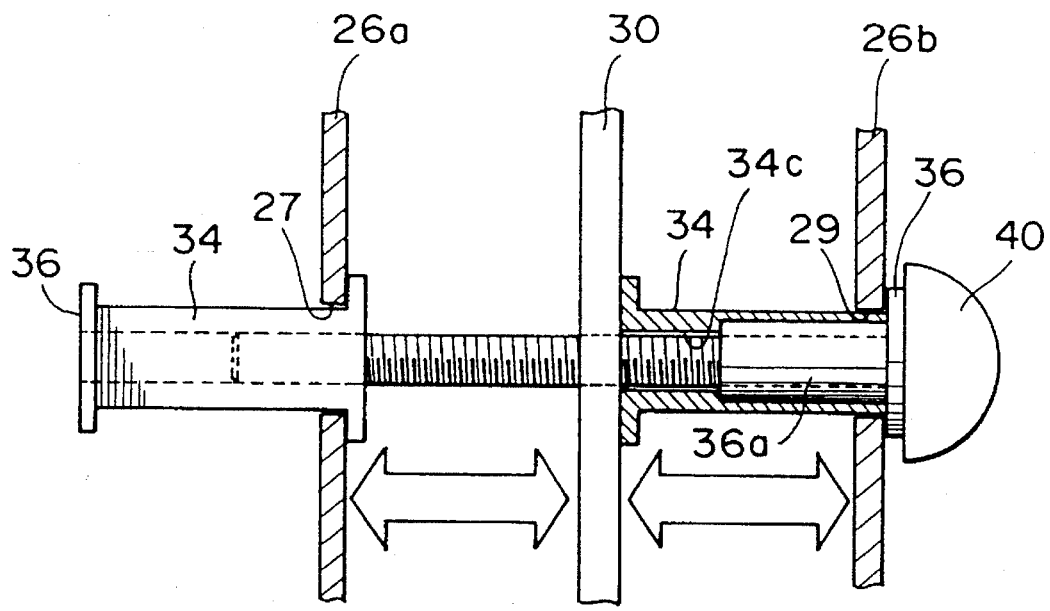
FIGS. 5A and 5B are partly sectional side views of the means for fixing the back-board mounting frame.
Figure 5B:
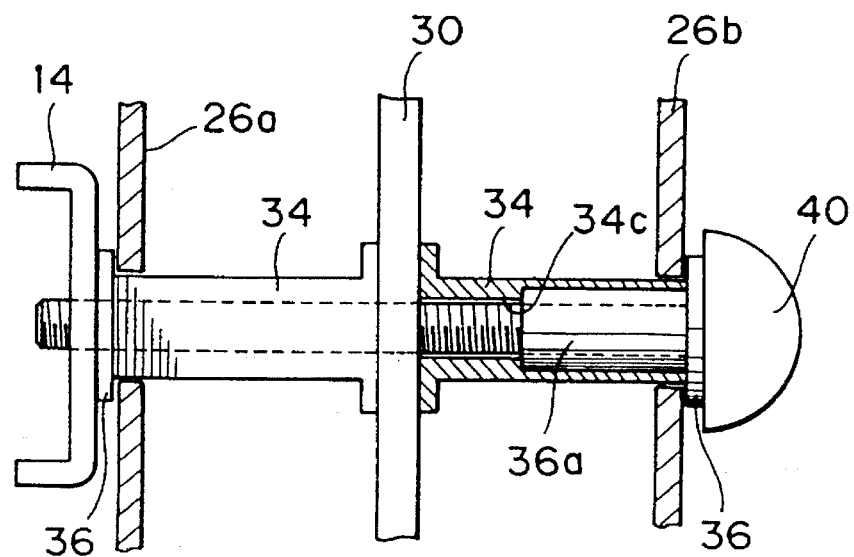

Then, as shown in FIG. 5A, a screw 40 is inserted into the insert nut 36, the mold member 34, the back wiring board 30, another mold member 34, and another insert nut 36. With the screw 40 thus inserted, the back-board mounting frame 16 is mounted on the shelf 2 and when the screw 40 is tightened, the screw 40 is threadedly engaged in the threaded hole 15 of the intermediate cross beam 14 as shown in FIG. 5B and the back-board mounting frame 16 is fixed to the shelf 2.

The back-board mounting frame 16 is fixed at two fixing positions thereof to the shelf 2. As shown in FIG. 5B, at the completion of a tightening of the screw 40, one of the molds 34 is intimately attached to the rear surface of the back wiring board 30, while the other mold member 34 is intimately attached to a front surface (connector loading surface) of the back wiring board 30. In this way, since the back wiring board 30 is fixed at two positions of an intermediate portion thereof to the shelf 2 so that the back wiring board 30 is incapable of moving forwardly and backwardly, a warp of the back wiring board 30 can effectively be prevented when an electronic circuit package is inserted in and removed from the connectors 32 of the back wiring board 30.

In this embodiment, although the back-board mounting frame 16 is fixed at two positions thereof to the shelf 2, the present invention is not limited to this embodiment. The fixing position may be one. Three or more fixing positions may also be employed.

Figure 6:
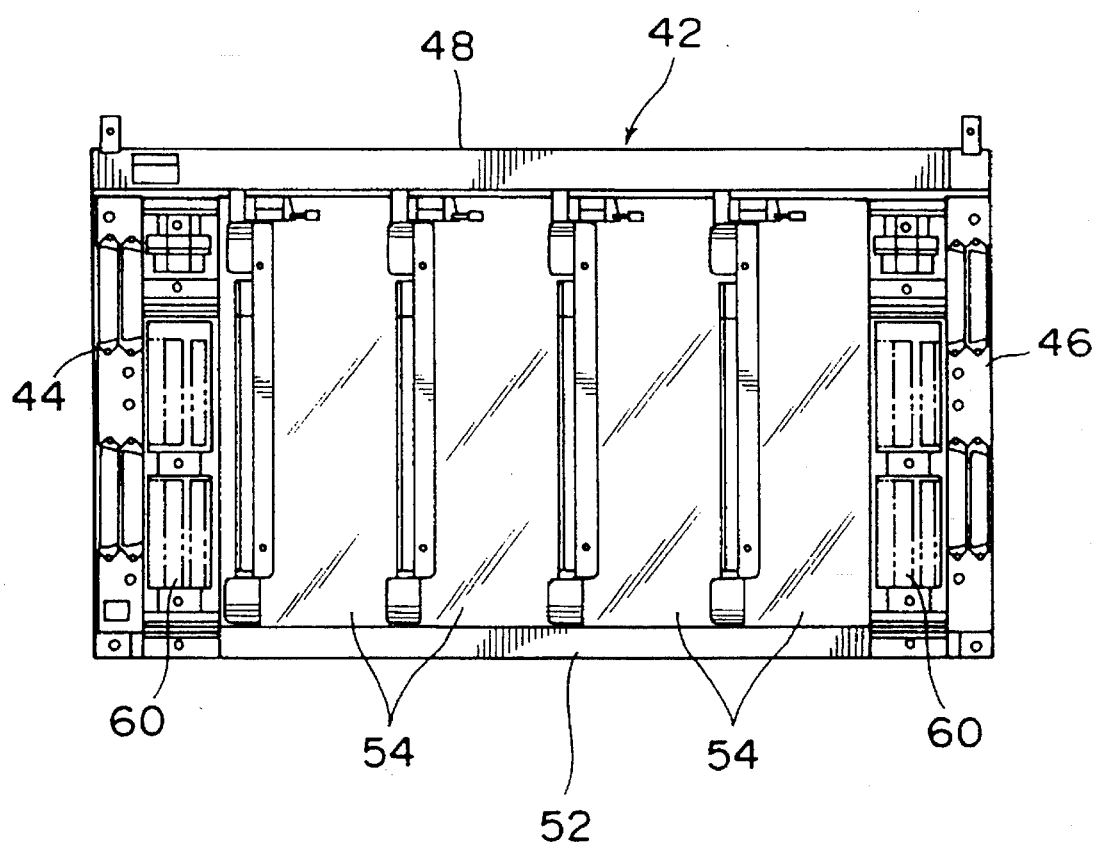
FIG. 6 is a front view of another shelf.
Figure 7:
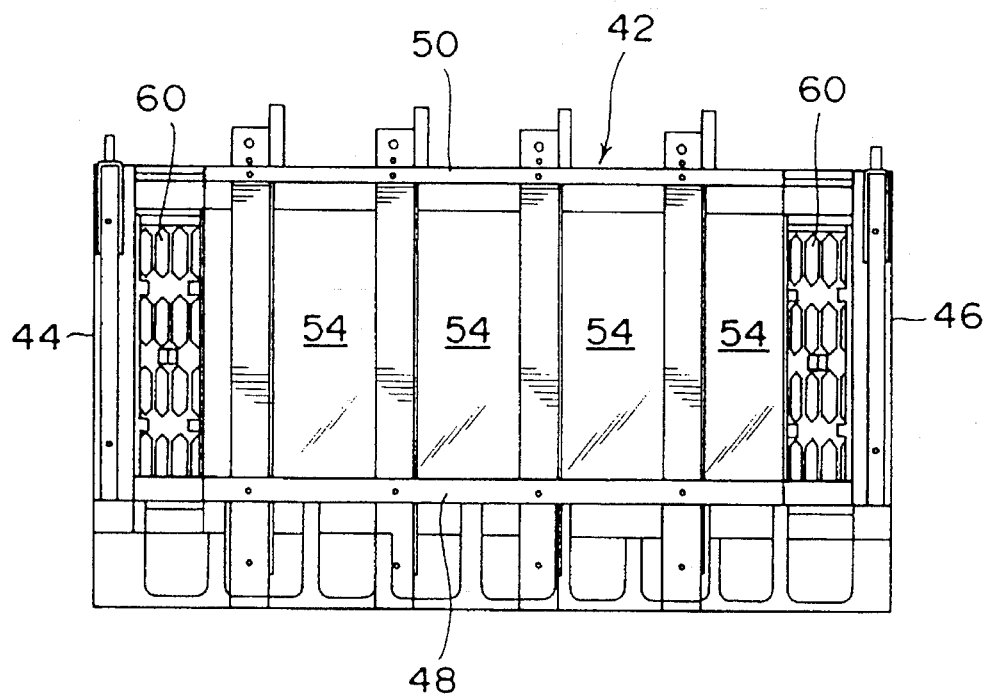
FIG. 7 is a plan view of the shelf of FIG. 6.
Figure 8:
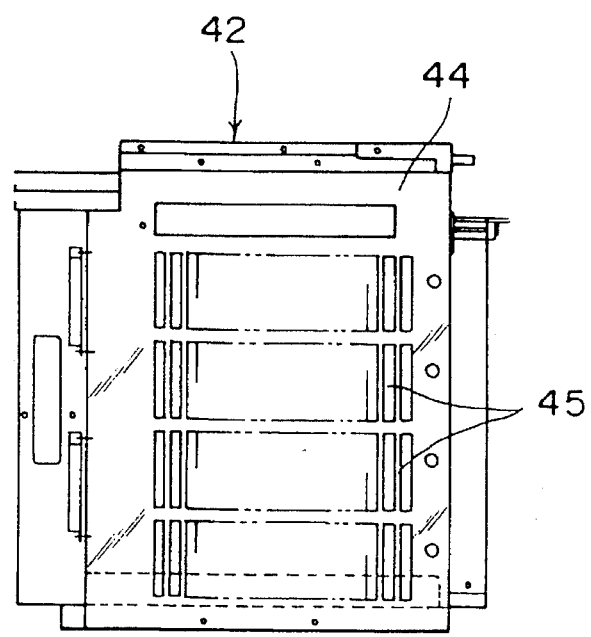
FIG. 8 is a left side view of the shelf of FIG. 6.

Referring next to FIGS. 6, 7 and 8, there are shown a front view, a plan view and a left side view of a shelf according to another embodiment of the present invention, respectively. The shelf 42 comprises a pair of side walls 44 and 46, upper members 48 and 50 for connecting the side walls 44 and 46, and a bottom member 52 for connecting the side walls 44 and 46. A plurality of vent holes 45 are formed in the side walls 44 and 46. Four insert positions 54 for allowing independent type units to be inserted therein are defined in an intermediate portion of the shelf 42. Sub-shelves 60 as later described in detail are inserted in opposite side portions of the shelf 42.

Figure 9:
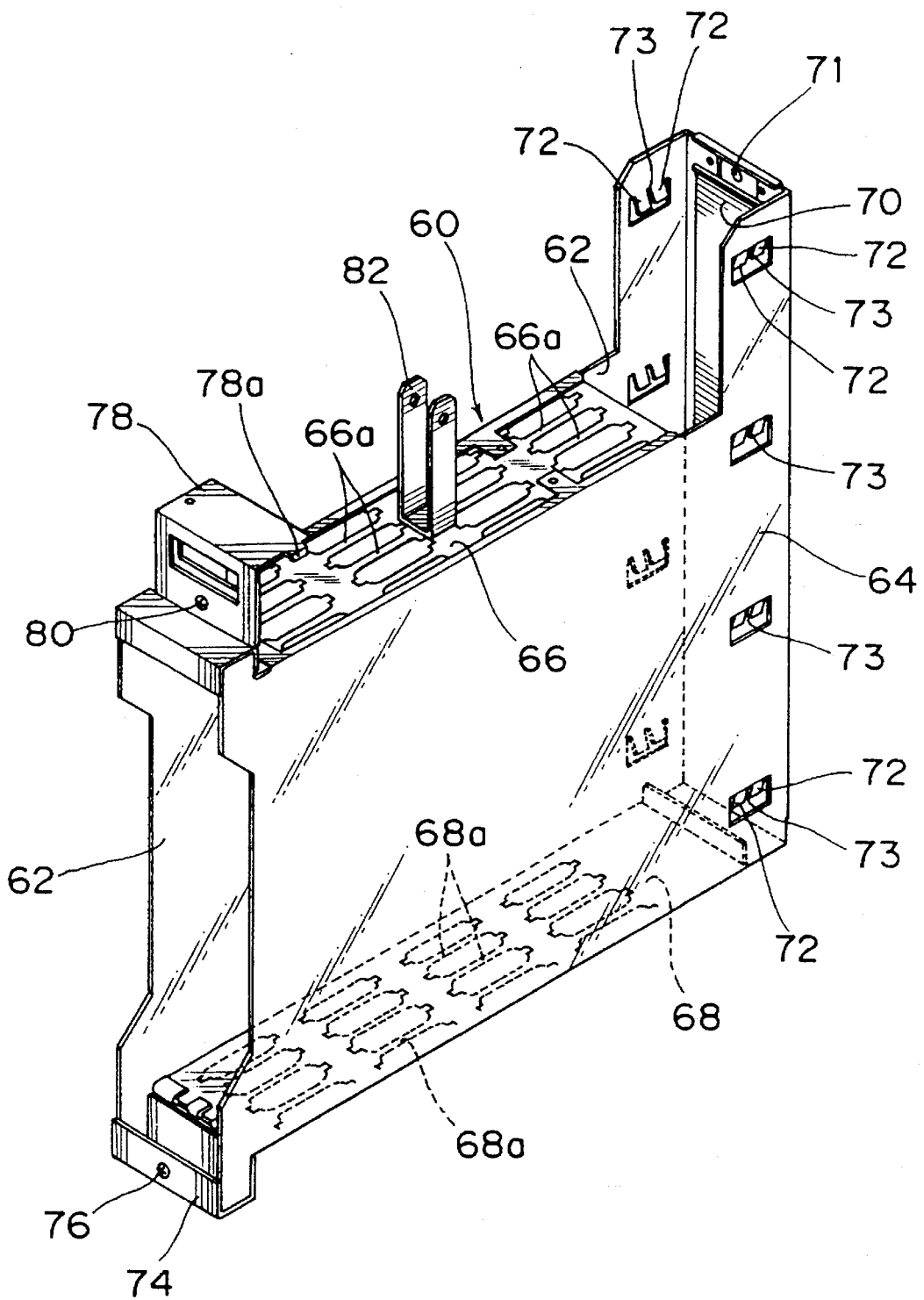
FIG. 9 is a perspective view of a sub-shelf.

FIG. 9 shows a perspective view of one of the sub-shelves 60. The sub-self 60 has a pair of side plates 62 and 64. The side plates 62 and 64 are connected by an upper member 66, a bottom member 68 and a back plate 70. A plurality of guide grooves 66a formed by downwardly press-punching the upper member 66 are formed in the upper member 66, and a plurality of guide grooves 68a formed by upwardlly press-punching the bottom member 68 are formed in the bottom member 68. Electronic circuit packages are inserted into the sub-shelf 60 guided by the guide grooves 66a and 68a.

Figure 10:
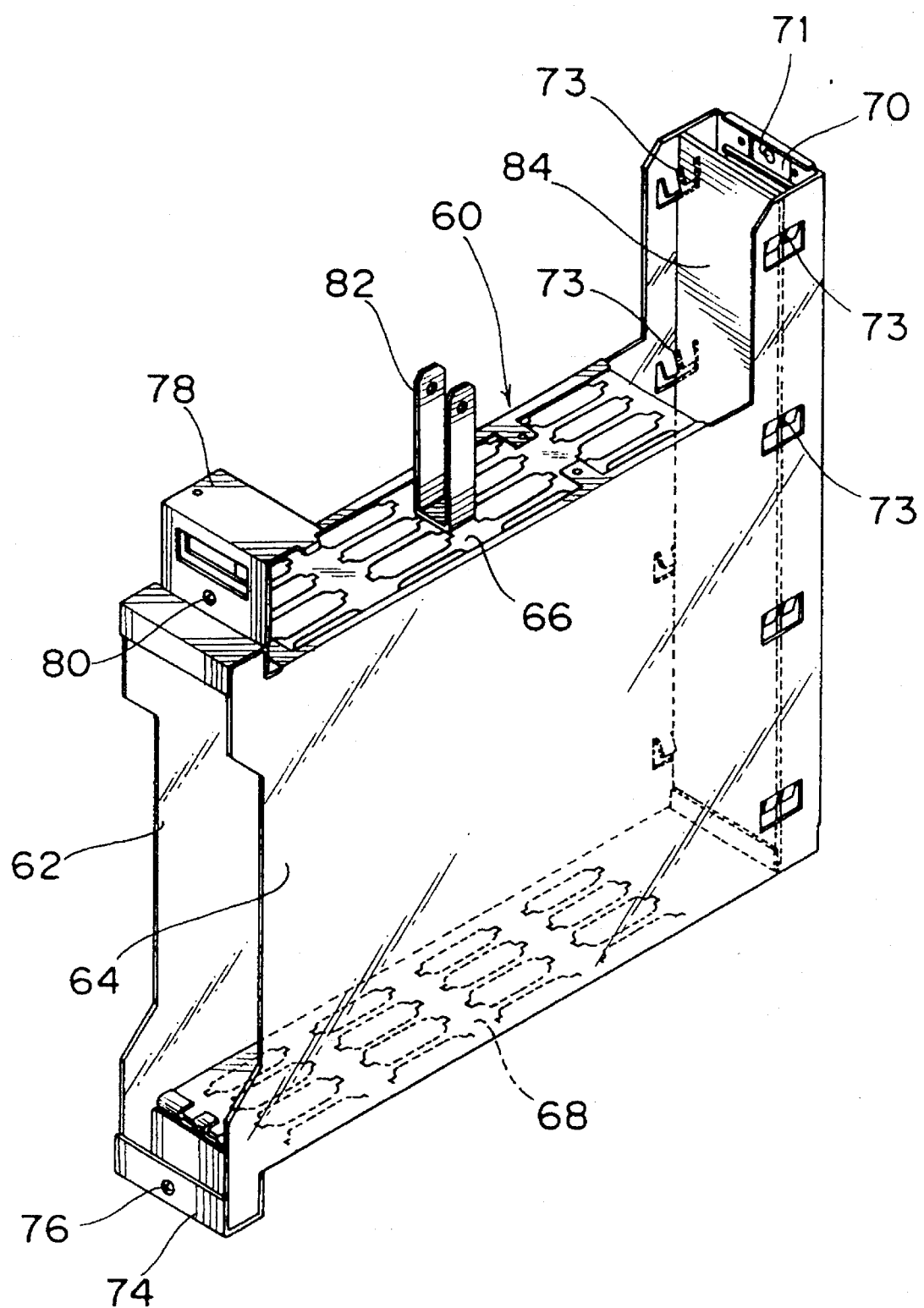
FIG. 10 is a perspective view of the sub-shelf with a back wiring board inserted therein.

The side plates 62 and 64 respectively have vertical guide grooves 73 defined between each adjacent upwardly press-punched portions 72 and 72 formed adjacent to the back plate 70. As shown in FIG. 10, a back wiring board 84 is inserted into the sub-shelf 60 from above along the guide grooves 73. A hole 71 is formed in an upper end portion of the back plate 70. A screw 76 with a neck is attached to a lower ejector hook portion 74 which is continuously formed on the bottom member 68. Another screw 80 with a neck is also attached to an L-shaped member 78 which is continuously formed on the upper member 66. The L-shaped member 78 is provided with an engagement projection 78a. A cable guiding U-shaped member 82 is secured to the upper member 66.

Figure 11:
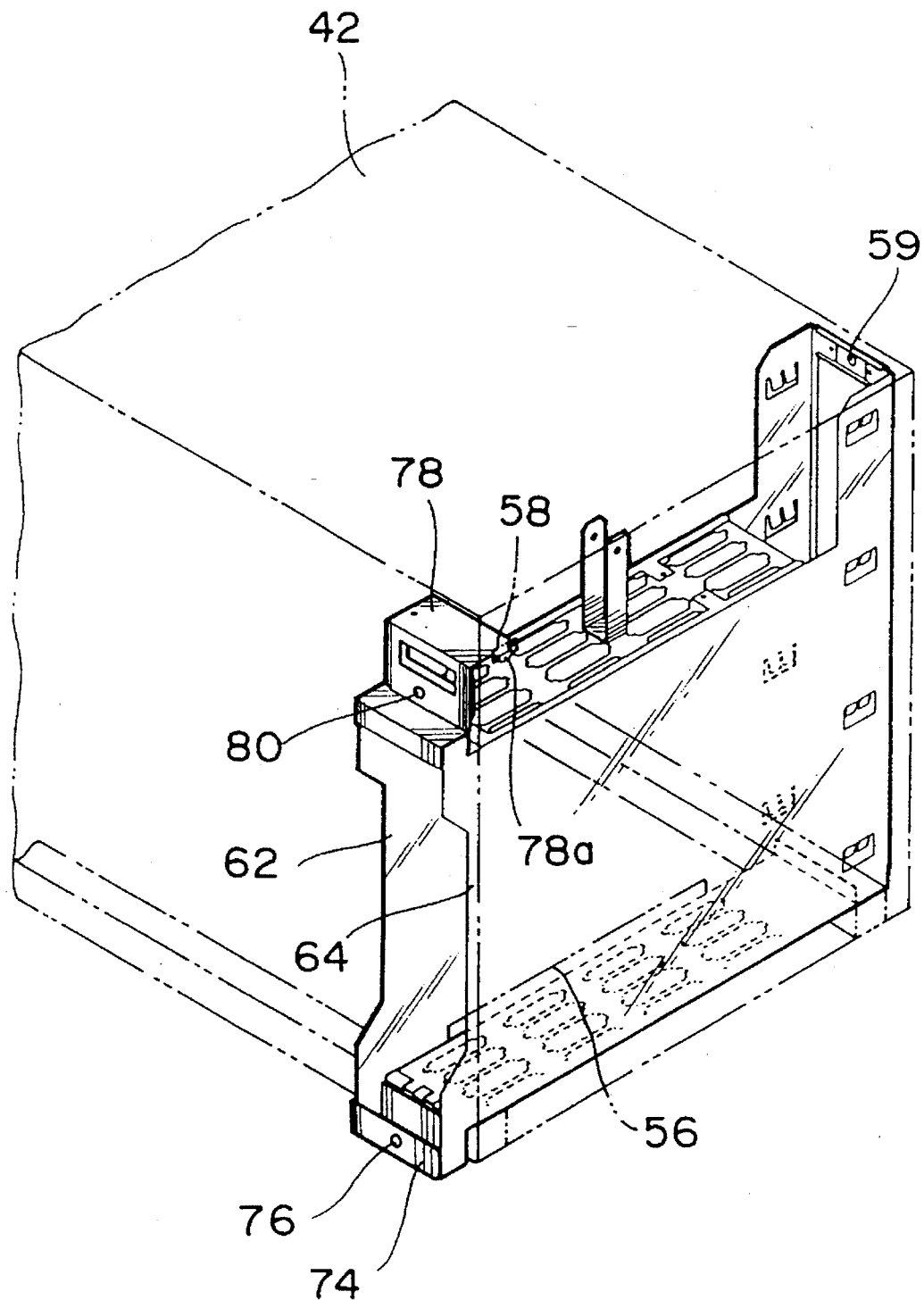
FIG. 11 is a schematic perspective view showing a mounting state of the sub-shelf on the shelf.

The sub-shelf 60 is mounted in the shelf in the following manner. That is, as shown in FIG. 11, the sub-shelf 60 is inserted into the shelf 42 from the front thereof along the shelf guide rail 56 formed on a bottom portion of the shelf 42, and a pin 59 provided on the shelf 42 is fitted into the hole 71 of the sub-shelf 60 to fix the rear side of the sub-shelf 60. To fix a lower front portion of the sub-shelf 60, the screw 76 with a neck attached to the lower ejector hook portion 74 is tightened. To fix an upper front portion of the sub-shelf 60, the engagement projection 78a of the L-shaped member 78 is hooked in the square hole 58 formed in the shelf 42 and the screw 80 with a neck is tightened to the shelf 42.

According to this embodiment, since the back wiring board 84 is inserted into the sub-shelf from above along the vertical grooves 73 formed in the side plates 62 and 64 of the sub-shelf 60, the back wiring board 84 can very easily be mounted on the sub-shelf 60. Connectors of the electronic circuit packages inserted in the sub-shelf 60 along the guide grooves 66a and 68a are plug-in connected to the connectors of the back wiring board 84 which is mounted on the sub-shelf 60.

According to the present invention, there can be exhibited such a meritorious effect that a simple mounting of the back wiring board to the shelf can be achieved. Furthermore, a structure of a back-board mounting frame is simplified and the shelf assembly is reduced in total weight.

What is claimed is:

1. A shelf assembly comprising:

a shelf including a pair of side walls, an upper member and a bottom member, and a cross beam for connecting said side walls on rear side thereof;

a back-board mounting frame having a pair of side plates each having a vertical guide groove, a first upper connection member and a second upper connection member for connecting said side plates, a first intermediate connection member and a second intermediate connection member for connecting said side plates, and a lower connection member for connecting said side plates;

a back wiring board inserted into said back-board mounting frame from above along said guide grooves formed in said side plates; and fixing means for fixing said back-board mounting frame to said shelf.

2. A shelf assembly according to claim 1, wherein each of said guide grooves of said back-board mounting frame is formed by upwardly press-punching said side plates.

3. A shelf assembly according to claim 1, wherein said fixing means comprises:

a first mold member including an insert portion inserted in a first hole formed in said first intermediate connection member and a head larger than said first hole, and having an axial through-hole formed therein;

a first insert nut including an insert portion inserted in said through-hole of said first mold member and a head larger than said first hole of said first intermediate connection member, and having an axial threaded hole formed therein; and a screw inserted in said first mold member and said first insert nut through a second hole formed in said second intermediate connection member and through a third hole formed in said back wiring board, and tightened to said cross beam.

4. A shelf assembly according to claim 3, wherein said fixing means further comprises:

a second mold member including an insert portion inserted in said second hole formed in said second intermediate connection member and a head larger than said second hole, and having an axial through-hole formed therein; and a second insert nut including an insert portion inserted in said through-hole of said second mold member and a head larger than said second hole formed in said second intermediate connection member, and having an axial threaded hole formed therein.

5. A shelf assembly comprising:

a first shelf including a pair of side walls, an upper member and a bottom member for connecting said side walls, and a shelf guide rail formed on said bottom member;

a second shelf including a pair of side plates, an upper member and a bottom member each having a plurality of guide grooves and adapted to connect said side plates, and a back plate for connecting said side plates, each of said side plates having a vertical guide groove formed therein adjacent to said back plate, said second shelf being inserted in said first shelf along said shelf guide rail;

a back wiring board inserted into said second shelf from above along said guide grooves formed in said side plates of said second shelf; and fixing means for fixing said second shelf to said first shelf.

6. A shelf assembly according to claim 5, wherein said fixing means comprises a pin projecting from said first shelf and adapted to fit in a hole formed in said back plate of said second shelf, and a screw for tightening said second shelf to said first shelf.

7. A shelf assembly according to claim 5, wherein said vertical guide grooves formed in each of said side plates of said second shelf are formed by upwardly press-punching said side plates.

* * * * *